(12) United States Patent
Leirer et al.

(10) Patent No.: US 12,324,282 B2
(45) Date of Patent: Jun. 3, 2025

(54) OPTOELECTRONIC ARRANGEMENT AND METHOD FOR PRODUCING AN OPTOELECTRONIC ARRANGEMENT

(71) Applicant: OSRAM OLED GmbH, Regensburg (DE)

(72) Inventors: Christian Leirer, Friedberg (DE); Korbinian Perzlmaier, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 243 days.

(21) Appl. No.: 17/973,247

(22) Filed: Oct. 25, 2022

(65) Prior Publication Data
US 2023/0054120 A1    Feb. 23, 2023

Related U.S. Application Data

(63) Continuation of application No. 17/072,899, filed on Oct. 16, 2020, now Pat. No. 11,527,678, which is a
(Continued)

(30) Foreign Application Priority Data
Jul. 16, 2015    (DE) .................. 10 2015 111 574

(51) Int. Cl.
*H10H 20/831*    (2025.01)
*H10F 39/12*    (2025.01)
(Continued)

(52) U.S. Cl.
CPC ......... *H10H 20/8312* (2025.01); *H10F 39/12* (2025.01); *H10F 77/20* (2025.01);
(Continued)

(58) Field of Classification Search
CPC ..... H01L 33/382; H01L 27/146; H01L 27/15; H01L 31/0224; H01L 31/02327;
(Continued)

(56) References Cited

U.S. PATENT DOCUMENTS 10,854,783 B2    12/2020  Leirer et al.
2009/0078955 A1*  3/2009  Fan .................. H01L 27/15
                                                438/46
(Continued)

FOREIGN PATENT DOCUMENTS

DE    102007062046 A1    6/2009
DE    102008016525 A1    11/2009
(Continued)

OTHER PUBLICATIONS

German Examination Report issued in corresponding German Patent Application No. 11 2016 003 199.8 dated Jan. 17, 2025, with English language translation, 8 pages.

*Primary Examiner* — Thanhha S Pham
(74) *Attorney, Agent, or Firm* — MH2 Technology Law Group LLP

(57) ABSTRACT

An optoelectronic arrangement is specified, including a moulded body having a base surface, a first pixel group with a multiplicity of pixels assigned thereto, each having a first semiconductor region, a second semiconductor region and an active region, a multiplicity of separating structures arranged between the pixels, and at least one first contact structure having a first contact plane and a first contact location, which is freely accessible at the base surface, wherein the pixels of the first pixel group are arranged alongside one another at the top surface, the first semiconductor regions and/or the second semiconductor regions of adjacent pixels of the first pixel group are electrically insulated from one another by means of the separating structures, a first contact structure is assigned one-to-one to
(Continued)

the first pixel group, and the first semiconductor regions of the pixels of the first pixel group are electrically conductively connected to one another by means of the first contact plane and are electrically contactable by means of the first contact location.

10 Claims, 8 Drawing Sheets

Related U.S. Application Data continuation of application No. 15/743,606, filed as application No. PCT/EP2016/066170 on Jul. 7, 2016, now Pat. No. 10,854,783.

(51) Int. Cl.
    *H10F 77/20*     (2025.01)
    *H10F 77/40*     (2025.01)
    *H10H 20/813*     (2025.01)
    *H10H 20/83*     (2025.01)
    *H10H 20/832*     (2025.01)
    *H10H 29/10*     (2025.01)

(52) U.S. Cl.
    CPC ......... *H10F 77/413* (2025.01); *H10H 20/813* (2025.01); *H10H 20/83* (2025.01); *H10H 20/835* (2025.01); *H10H 29/10* (2025.01)

(58) Field of Classification Search
    CPC ....... H01L 33/08; H01L 33/36; H01L 33/405; H10F 77/20; H10F 77/413; H10H 20/83; H10H 20/8312; H10H 20/8314; H10H 20/835
    See application file for complete search history.

(56) References Cited

U.S. PATENT DOCUMENTS

| | | |
|---|---|---|
| 2009/0109539 A1* | 4/2009 | Devos ................ H10K 50/84 264/2.7 |
| 2012/0074441 A1 | 3/2012 | Seo et al. |
| 2012/0086026 A1 | 4/2012 | Engl et al. |
| 2013/0175560 A1 | 7/2013 | Odnoblyudov et al. |
| 2014/0209955 A1 | 7/2014 | Kim et al. |
| 2015/0014716 A1 | 1/2015 | von Malm |
| 2015/0185137 A1 | 7/2015 | Amari |
| 2015/0294961 A1 | 10/2015 | Moosburger et al. |
| 2015/0325598 A1 | 11/2015 | Pfeuffer et al. |

FOREIGN PATENT DOCUMENTS

| | | |
|---|---|---|
| DE | 102009036621 A1 | 2/2011 |
| DE | 102012112302 A1 | 6/2014 |
| DE | 102013102667 A1 | 10/2014 |
| DE | 102013109031 A1 | 2/2015 |
| DE | 102015211185 A1 | 12/2016 |
| DE | 102015112280 A1 | 2/2017 |
| DE | 102015113310 A1 | 2/2017 |
| DE | 102015115900 A1 | 3/2017 |
| DE | 102015117198 A1 | 4/2017 |
| EP | 2657998 A2 | 10/2013 |
| JP | S52138350 U | 10/1977 |
| JP | S5464470 U | 5/1979 |
| JP | S55-58584 A | 5/1980 |
| JP | 2010-87515 A | 4/2010 |
| JP | 2011513957 A | 4/2011 |
| JP | 2011513959 A | 4/2011 |
| JP | 2012114184 A | 6/2012 |
| JP | 2013232503 A | 11/2013 |
| JP | 2015501085 A | 1/2015 |
| JP | 2015501086 A | 1/2015 |
| WO | 2014056911 A1 | 4/2014 |
| WO | 2014090605 A1 | 6/2014 |

* cited by examiner

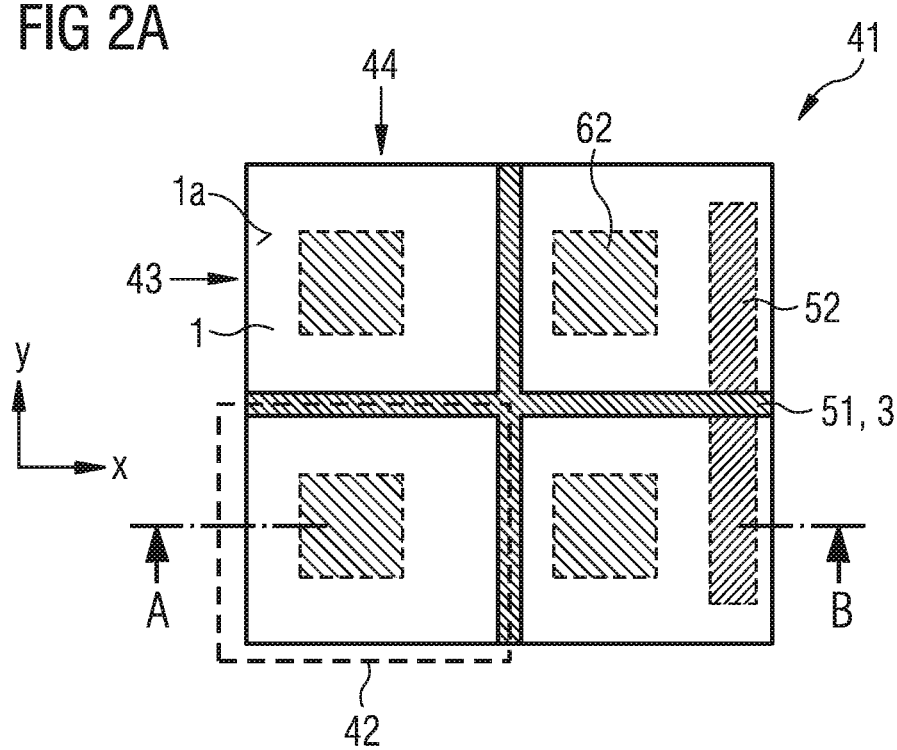
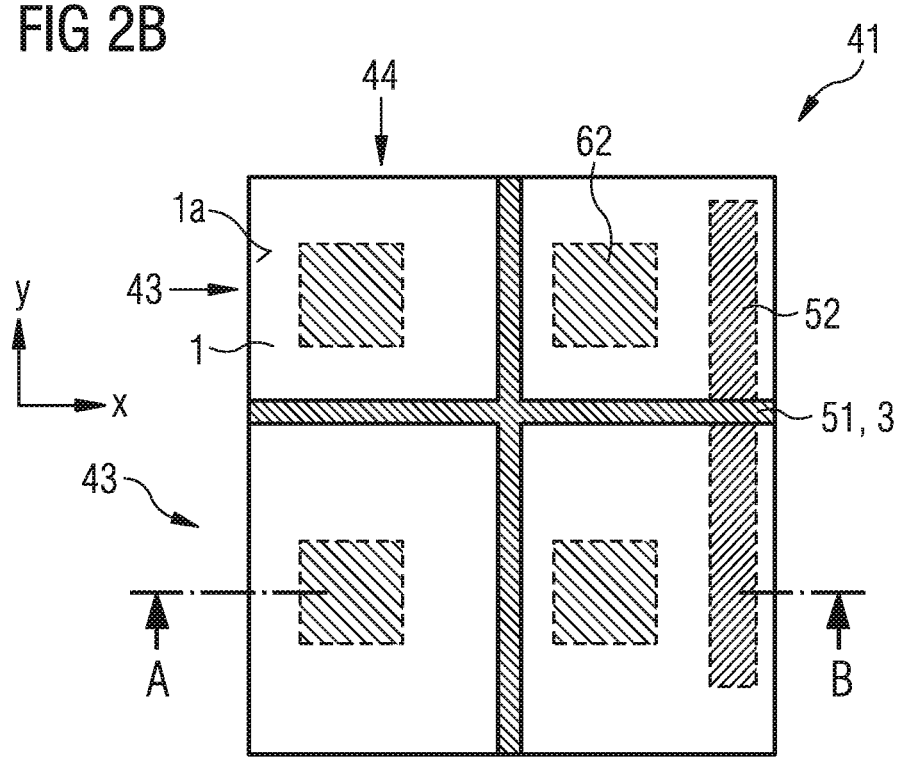

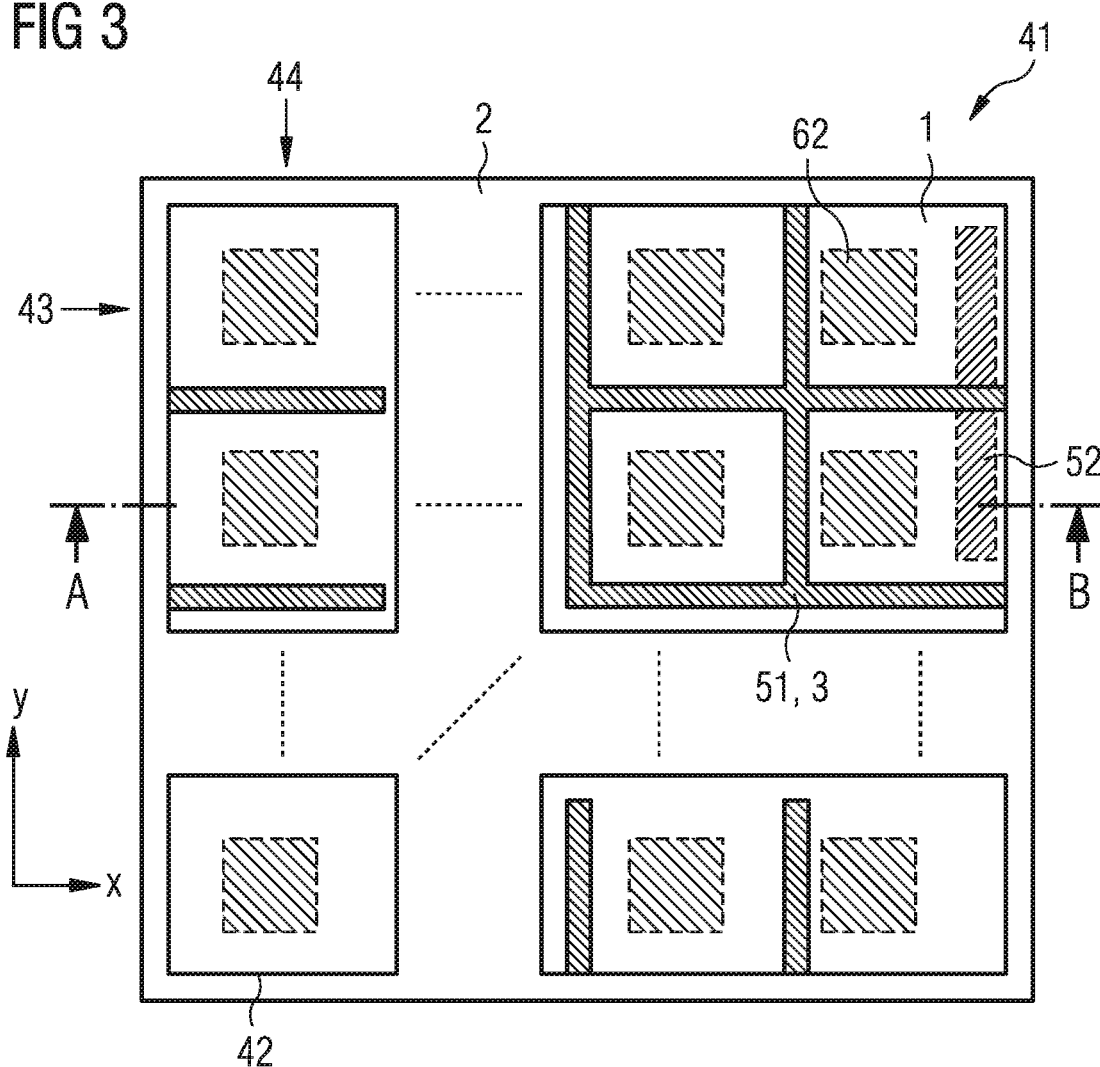

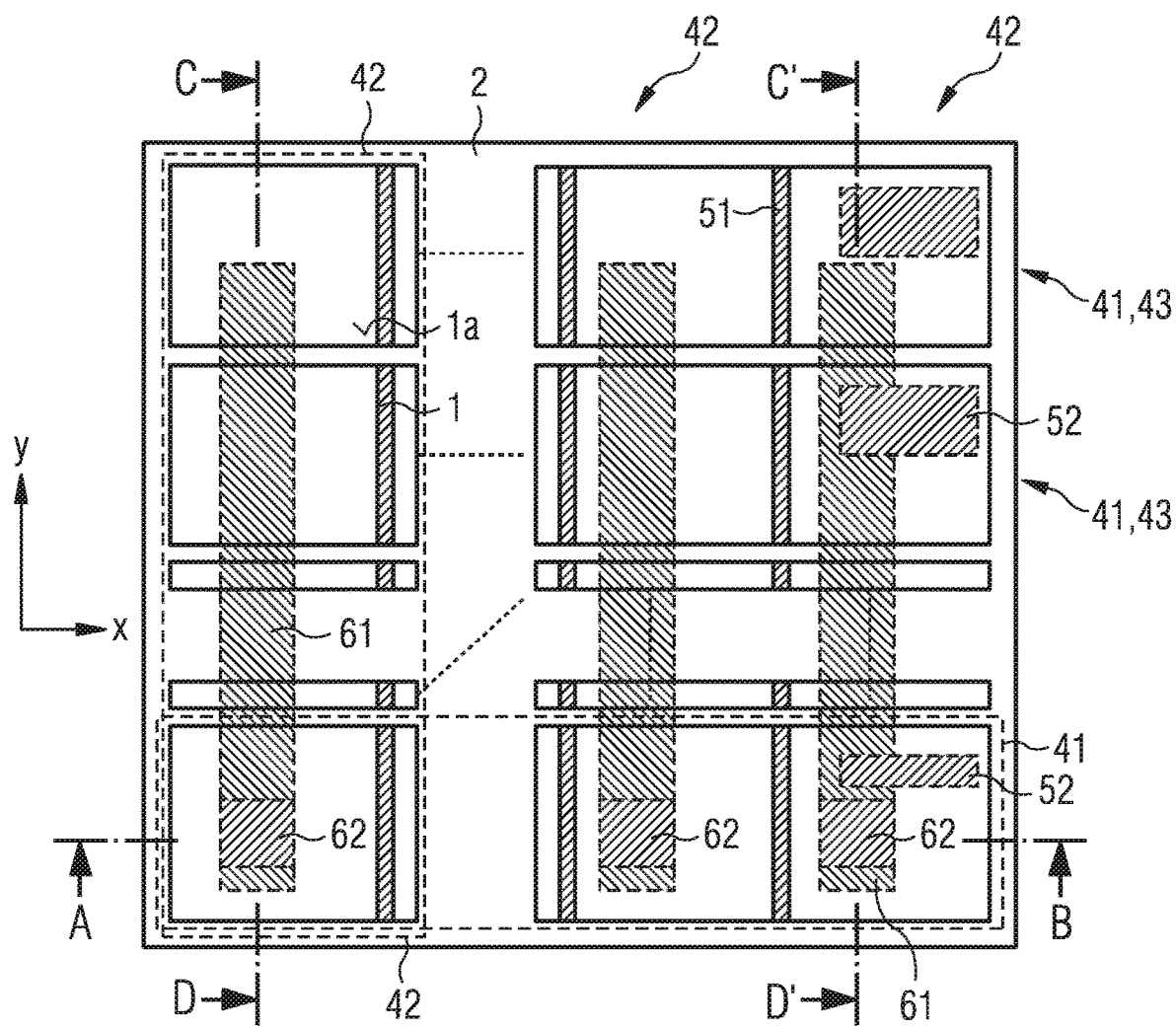

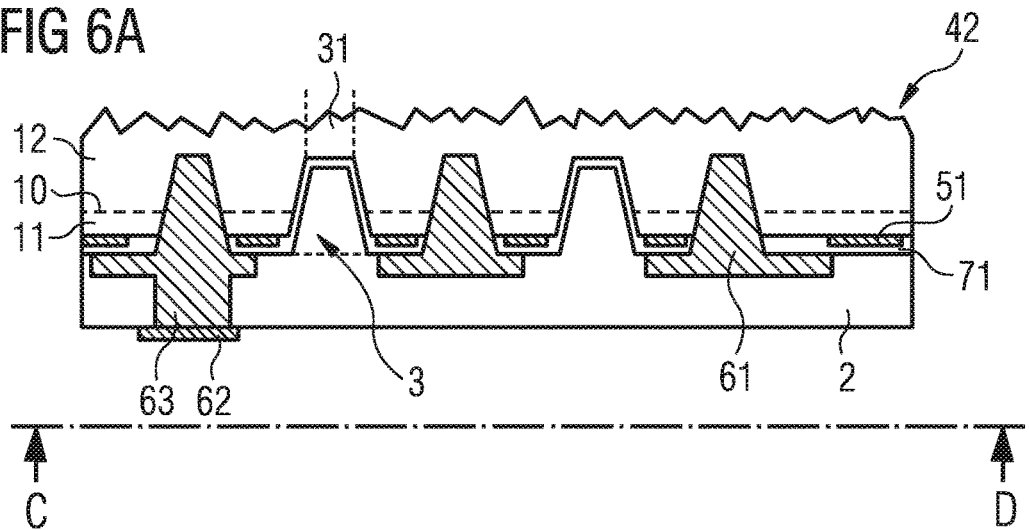
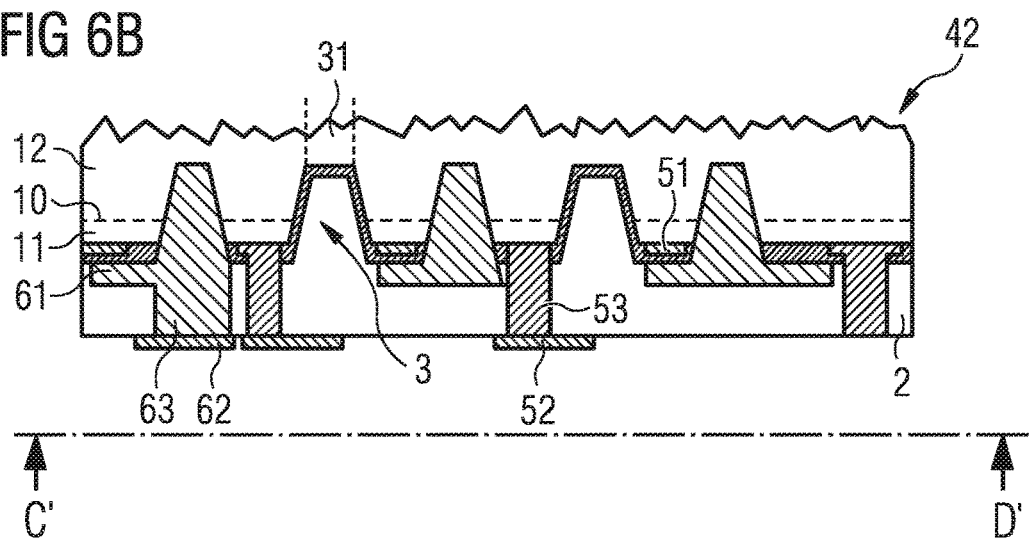
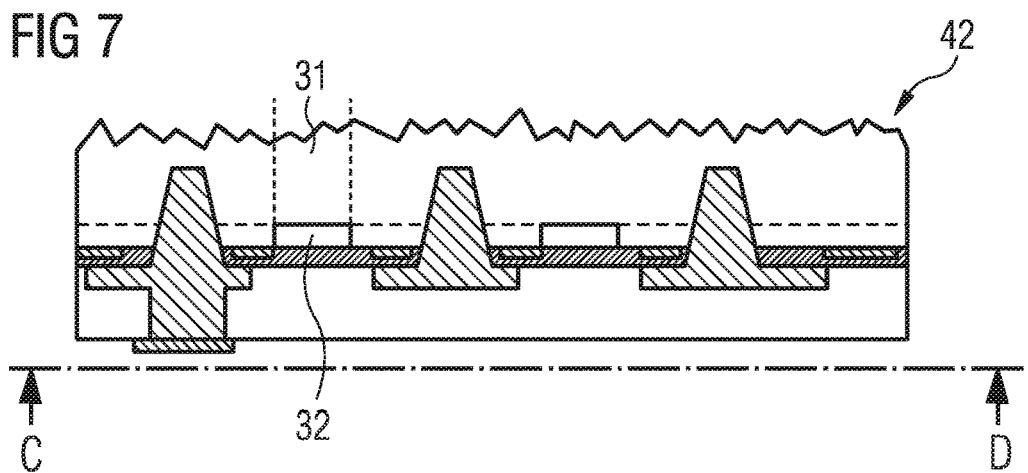

OPTOELECTRONIC ARRANGEMENT AND METHOD FOR PRODUCING AN OPTOELECTRONIC ARRANGEMENT

CROSS REFERENCE TO RELATED APPLICATIONS

This application is a continuation of U.S. application Ser. No. 17/072,899 filed Oct. 16, 2020, now allowed, which is a continuation of U.S. Pat. No. 10,854,783 B2, issued Dec. 1, 2020, which claims priority to PCT application PCT/EP2016/066170 filed on Jul. 7, 2016, which claims priority to foreign application (DE) 10 2015 111 574.3 filed Jul. 16, 2015, the disclosures of which are hereby incorporated by reference in their entireties.

One object to be achieved consists in specifying an optoelectronic arrangement that can be produced in a simplified manner. A further object to be achieved consists in specifying a simplified method for producing an optoelectronic arrangement.

An optoelectronic arrangement is specified. The optoelectronic arrangement can be provided for emitting and/or for absorbing an electromagnetic radiation. The optoelectronic arrangement can be a light emitting diode arrangement, such as a display, for example, and/or a photodiode arrangement.

In accordance with at least one embodiment, the optoelectronic arrangement comprises a moulded body having a top surface and a bottom surface facing away from the top surface. The moulded body is embodied as a carrier of the optoelectronic arrangement. The moulded body can be formed with a plastics material and/or a, more particularly synthetic, resin or consist of one of these materials. In particular, the moulded body is not a growth substrate of the optoelectronic arrangement. The moulded body can be embodied in an electrically insulating fashion. Furthermore, the moulded body can be embodied in an integral fashion, that is to say in a continuous fashion. By way of example, the moulded body is a potting component. Furthermore, the moulded body can be embodied in a layerlike fashion, for instance as a conformally overmoulding, preferably electrically insulating, layer.

The moulded body has a main extension plane in which it extends in lateral directions. The top surface and the bottom surface of the moulded body respectively form a principal plane of the moulded body. Perpendicular to the main extension plane, in a vertical direction, the moulded body has a thickness. The thickness of the moulded body is small in comparison with the maximum extension of the moulded body in the lateral directions. By way of example, the thickness of the moulded body is at least 80 μm and at most 120 μm. Alternatively, it is possible for the thickness of the moulded body to be at least 1 μm and at most 10 μm, preferably at most 8 μm.

In accordance with at least one embodiment, the optoelectronic arrangement comprises a first pixel group. A multiplicity of pixels are assigned to the first pixel group. In other words, the first pixel group comprises a multiplicity of pixels. Each of the pixels of the first pixel group has a first semiconductor region, a second semiconductor region and an active region. The active region emits and/or absorbs the electromagnetic radiation during the operation of the arrangement. The first semiconductor region, the second semiconductor region and the active region can in each case be formed with a (compound) semiconductor material or consist thereof. By way of example, the first semiconductor region, the second semiconductor region and the active region are based in each case on GaN. The pixels can be individual segments of the arrangement. The pixels can have in the lateral directions in each case a maximum extent of at least 30 μm and at most 300 μm, preferably at most 100 μm and particularly preferably at most 50 μm.

Here and hereinafter a "pixel group" can be a set of pixels which are grouped on the basis of common properties. The common properties are for example a common electrical contacting of the first semiconductor regions and/or of the second semiconductor regions of the pixels of a pixel group. The first semiconductor regions and/or the second semiconductor regions of the pixels of a pixel group can then be at a common electrical potential. Alternatively or additionally, the common properties can be provided by a common spatial arrangement of the pixels of a pixel group, such as, for example, an arrangement in a common row or a common column of a matrix.

In accordance with at least one embodiment, the optoelectronic arrangement comprises a multiplicity of separating structures. The separating structures are arranged between the pixels. The separating structures can serve for spatially separating at least portions of the pixels. Furthermore, the pixels can be optically decoupled from one another by means of the separating structures.

In accordance with at least one embodiment, the optoelectronic arrangement comprises at least one first contact structure. The at least one first contact structure comprises a first contact plane and a first contact location. The first contact location is freely accessible at the bottom surface. In particular, the first contact location is electrically contactable externally at the bottom surface. The first contact structure can be embodied in an electrically conductive fashion. In particular the first contact plane and the first contact location can be formed with at least one metal or consist thereof. All components of the first contact structure can be at a common electrical potential. In other words, the first contact plane, the first contact location and if appropriate further components of the first contact structure are electrically conductively connected to one another.

In accordance with at least one embodiment of the optoelectronic arrangement, the pixels are arranged at the top surface alongside one another. Here and hereinafter, "arranged at the top surface" can mean that the pixels are arranged in a common plane running parallel to the top surface within the scope of the production tolerances. Further components of the arrangement, such as, for example, the first contact plane and/or an insulation layer, can then be arranged between the pixels and the moulded body. Alternatively or additionally, the pixels can directly adjoin the top surface at least in some locations.

Each of the pixels can have a radiation passage surface facing away from the moulded body. The electromagnetic radiation emitted and/or absorbed by the active region passes through the radiation passage surface of the pixel. The radiation passage surfaces can form for example a common luminous surface of the arrangement that is segmented on account of the radiation passage surfaces of the pixels separated by means of the separating structures.

The pixels can furthermore be arranged laterally at a distance from one another. By way of example, a lateral distance between two adjacent pixels is at least 1 μm and at most 20 μm, preferably at most 7 μm, and particularly preferably at most 5 μm. Here and hereinafter, the lateral distance is the minimum distance between two outer surfaces of the pixels in one of the lateral directions. Furthermore, here and hereinafter, pixels can be "adjacent" if they are arranged directly alongside one another in the lateral directions. In each case at least one of the separating structures can be arranged between two pixels. By way of example, the pixels are arranged in a matrixlike fashion, that is to say in rows and columns, at the top surface.

In accordance with at least one embodiment of the optoelectronic arrangement, the first semiconductor regions and/or the second semiconductor regions of adjacent pixels are electrically insulated from one another by means of the separating structures. For this purpose, the separating structures can comprise an electrically insulating material. The electrically insulating material can be a passivation layer, for example, which can be formed with an oxide and/or a nitride, a plastic or a gas, such as, for example, an ambient atmosphere in an apparatus in which the arrangement is produced. Furthermore, the first semiconductor regions and/or the second semiconductor regions of adjacent pixels can be spatially separated from one another by means of the separating structures.

In accordance with at least one embodiment of the optoelectronic arrangement, a first contact structure is assigned one-to-one to the first pixel group. In particular, it is possible for a first contact location to be assigned one-to-one to the first pixel group.

In accordance with at least one embodiment, the pixels of the first pixel group are electrically conductively connected to one another by means of the first contact plane, in particular the first contact plane of the first contact structure assigned one-to-one to said first pixel group. The first contact plane can be at least regionally in direct contact with the first semiconductor regions of the pixels of the first pixel group. It is possible for the first semiconductor regions to be electrically conductively connected to one another exclusively by means of the first contact plane.

In accordance with at least one embodiment of the optoelectronic arrangement, the first semiconductor regions of the pixels of the first pixel group are electrically conductively contactable by means of the first contact location, in particular the first contact location of the first contact structure assigned one-to-one to said first pixel group. For this purpose, the first contact location can be electrically conductively connected to the first contact plane. By way of example, the arrangement is a surface mountable device (SMD). An electrical contacting of the first contact location can then be carried out by means of a soldering connection.

In accordance with at least one embodiment, the optoelectronic arrangement comprises a moulded body embodied as a carrier and having a top surface and a bottom surface facing away from the top surface, a first pixel group, a multiplicity of separating structures and a first contact structure. The first pixel group has a multiplicity of pixels, each comprising a first semiconductor region, a second semiconductor region and an active region that emits and/or absorbs electromagnetic radiation during the operation of the arrangement. The multiplicity of separating structures are arranged between the pixels. The first contact structure has a first contact plane and a first contact location that is freely accessible at the bottom surface. The pixels are arranged at the top surface alongside one another. The first semiconductor regions and/or the second semiconductor regions of the adjacent pixels are electrically insulated from one another by means of the separating structures. A first contact structure is assigned one-to-one to the first pixel group. Furthermore, the first semiconductor regions of the pixels of the first pixel group are electrically conductively connected to one another by means of the first contact plane and are electrically contactable by means of the first contact location.

In accordance with at least one embodiment of the optoelectronic arrangement, the first contact location comprises the sole contact location of the at least one first contact structure that is freely accessible at the bottom surface of the moulded body. In other words, the first contact structure has a single first contact location. In particular, it is possible for the first semiconductor regions of the pixels of the first pixel group to be electrically contactable externally exclusively by means of the first contact location.

In accordance with at least one embodiment of the optoelectronic arrangement, the moulded body is embodied as a mechanically stabilizing component of the arrangement. Here and hereinafter, "mechanically stabilizing" means that the mechanical handling of the optoelectronic arrangement is improved by means of the moulded body and as a result, for example, a higher external force can act on the optoelectronic arrangement, without the latter being destroyed. In particular, the optoelectronic arrangement can become mechanically self-supporting by means of the moulded body, that is to say that the optoelectronic arrangement can be handled for instance in the context of a manufacturing method with tools such as tweezers, for example, without a further supporting element having to be present.

The use of a moulded body as a mechanically stabilizing element enables in particular the simplified production of the optoelectronic arrangement. Furthermore, the moulded body guarantees a high mechanical stability.

It is furthermore possible for a conversion material for the wavelength conversion of the electromagnetic radiation emitted and/or absorbed by the active regions to be applied on at least one of the radiation passage surfaces, preferably on at least 50% of the radiation passage surfaces, and particularly preferably on all of the radiation passage surfaces. By way of example, the conversion material can be applied to the radiation passage surfaces as potting. The potting can be formed with a silicone or an epoxy resin into which wavelength-converting particles, such as, for example, phosphor particles or quantum dots are introduced. Alternatively, the conversion material can be present as a converter lamina, in particular as a ceramic converter lamina. In particular, it is possible for a single converter lamina to be applied on at least 50% of the radiation passage surfaces. The converter lamina can then likewise have a mechanically stabilizing effect. By way of example, the converter lamina can be produced by means of electrophoresis. Moreover, the conversion material can be applied to the radiation passage surfaces as a layer, for example by means of spray coating.

In accordance with at least one embodiment of the optoelectronic arrangement, the moulded body is formed with at least one of the following materials or consists of one of the following materials: epoxy resin, silicone resin. These materials can be applied in particular by means of a compression moulding method, an injection moulding method and/or a transfer moulding method.

In accordance with at least one embodiment of the optoelectronic arrangement, the separating structures are formed by trenches that are free of the material of the pixels. The first semiconductor regions, the active regions and/or the second semiconductor regions of adjacent pixels are spatially separated from one another by the trenches. In particular, the first semiconductor regions, the active regions and/or the second semiconductor regions are not connected to one another by a semiconductor material. The trenches can be etching trenches, for example, which have been introduced into a semiconductor layer sequence from which the first semiconductor regions, the active regions and/or the second semiconductor regions can emerge during a production method.

In accordance with at least one embodiment of the optoelectronic arrangement, the moulded body extends into the trenches. In other words, the moulded body is arranged at least in some locations between the pixels. In particular the trenches can be completely filled with the moulded body. By means of the moulded body introduced into the trenches, an anchoring of the moulded body to the pixels can be carried out. Furthermore, the mechanical stability of the arrangement can additionally be increased by the introduction of the moulded body into the trenches.

The moulded body can be embodied in a radiation-nontransmissive fashion. An optical isolation of the pixels can then be carried out for example by means of the moulded body introduced into the trenches.

Furthermore, it is possible for the moulded body to be embodied in a radiation-reflecting fashion. By way of example, for this purpose, radiation-reflecting particles can be embedded into the moulded body. Here and hereinafter, a component of the arrangement is "radiation-nontransmissive" if it has a transmission factor of at most 40%, preferably at most 20% and particularly preferably at most 10% for the electromagnetic radiation emitted and/or absorbed by the active regions. Furthermore, here and hereafter, a component of the arrangement is "radiation-reflecting" if it has a reflectance of at least 60%, preferably at least 80%, and particularly preferably at least 90%, for the electromagnetic radiation.

In accordance with at least one embodiment of the optoelectronic arrangement, the first semiconductor regions and the active regions of adjacent pixels are spatially completely separated from one another. In other words, the first semiconductor regions and the active regions of adjacent pixels are not connected to one another by a semiconductor material. Furthermore, the second semiconductor regions of adjacent pixels are connected to one another via intermediate regions. The intermediate regions are formed with the material of the second semiconductor regions. The second semiconductor regions of the pixels can thus be embodied in a continuous and integral fashion. In this case, it is possible for the intermediate regions to have a smaller extent in the vertical direction than the second semiconductor regions.

In accordance with at least one embodiment of the optoelectronic arrangement, a space between the pixels is at least regionally free of a semiconductor material. In particular, the space between the pixels can be completely free of a semiconductor material. In other words, it is possible for the first semiconductor regions, the active regions and the second regions of the pixels not to be connected to one another by a semiconductor material. The space between the pixels can be the separating structures formed by the trenches.

In accordance with at least one embodiment of the optoelectronic arrangement, a multiplicity of first pixel groups are present. A first contact structure is assigned one-to-one to each of the first pixel groups. The pixels of each of the first pixel groups can be electrically conductively connected to one another by means of the first contact plane assigned one-to-one to the respective first pixel group. Furthermore, the pixels of each of the first pixel groups can be electrically contactable electrically conductively with the first contact location assigned, in particular one-to-one, to the respective first pixel group.

In accordance with at least one embodiment, the optoelectronic arrangement comprises a multiplicity of second pixel groups. Furthermore, the arrangement comprises at least one second contact structure having at least one second contact plane and a second contact location. The second contact location can be the sole contact location of the second contact structure that is freely accessible at the bottom surface. The second contact location is freely accessible at the bottom surface. In other words, the second contact location is electrically contactable at the bottom surface. The second contact structure can comprise the same materials or be formed from the same materials as the first contact structure.

In accordance with at least one embodiment of the optoelectronic arrangement, at least one pixel of each of the first pixel groups is uniquely assigned to each second pixel group. Conversely, it is possible for a first pixel group to be uniquely assigned to each pixel of the second pixel group. In other words, a single first pixel group and a single second pixel group are assigned to each pixel of the optoelectronic arrangement. By way of example, the pixels are arranged in a matrixlike fashion at the top surface, wherein the pixels of the matrix that are arranged in a row are respectively assigned to one of the first pixel groups, while the pixels of the matrix that are arranged in a column are respectively assigned to one of the second pixel groups.

Furthermore, a second contact structure is assigned one-to-one to each second pixel group. The second semiconductor regions of the pixels of the second pixel group are electrically conductively connected to one another by means of the second contact plane and electrically contactable by means of the second contact location. In particular, the pixels of the second pixel group are electrically contactable with the second contact location of the second contact location assigned to said second pixel group. For this purpose, the second contact location can have the same construction as the first contact location.

In accordance with at least one embodiment of the optoelectronic arrangement, the at least one first contact structure has at least one first plated-through hole which extends in a vertical direction completely through the moulded body. Alternatively or additionally, the second contact structure present, if appropriate, can have at least one second plated-through hole which extends in a vertical direction completely through the moulded body. The first plated-through hole and/or the second plated-through hole, if appropriate, can have the same extent as the moulded body in the vertical direction. The first plated-through hole and/or the second plated-through hole, if appropriate, are/is electrically conductively connected to the first contact plane and/or to the second contact plane, respectively. Furthermore, the first plated-through hole and/or the second plated-through hole, if appropriate, are/is electrically conductively connected to the first contact location and/or to the second contact location, respectively.

By way of example, the plated-through hole extends from the bottom surface of the moulded body completely through the moulded body. Particularly preferably, the plated-through hole extends from the bottom surface of the moulded body completely through the moulded body and through the active layer of the semiconductor layer sequence. In this case, the plated-through hole is preferably formed by a single electrically conductive element, for example composed of a metal. The contact structure can be formed by the plated-through hole, the contact location and the contact plane. In accordance with one embodiment, the plated-through hole is in this case free of electronic components, such as switches, transistors or the like.

It is possible, in particular, for only the at least one first and the at least one second contact location to be provided for electrically contacting the arrangement. The arrangement then comprises exclusively electrical contact locations which are arranged at the bottom surface and are freely accessible at the latter. The electrical connection of the at least one first and/or of the at least one second contact location to the first and/or second semiconductor regions, respectively, in particular the first and/or second contact plane, respectively, can be effected in a wire-free fashion by means of the at least one first and/or the at least one second plated-through hole, respectively. The arrangement is in particular free of a wire contacting.

The use of plated-through holes for electrically connecting the contact locations and the semiconductor regions makes it possible, in particular, to provide a simply contactable arrangement without wire contacts. The electrical contacting can be effected in particular exclusively at the bottom surface of the moulded body. As a result, an arrangement comprising pixels arranged in a matrixlike fashion, in particular, can be realized in a simple manner. The optoelectronic arrangement can thus be a so-called flip-chip.

In accordance with at least one embodiment of the optoelectronic arrangement, the material of the first plated-through hole and/or of the second plated-through hole, if appropriate, is electrodeposited. The first and/or the second plated-through hole can comprise in each case at least one metal in particular copper, nickel, tin and/or gold. By way of example, the first and/or the second plated-through hole are/is electrodeposited onto a part of the first contact plane and/or of the second contact plane.

It is furthermore possible for the at least one first plated-through hole and/or the at least one second plated-through hole, if appropriate, to form a mechanically stabilizing component of the arrangement. By way of example, the first plated-through hole and/or the second plated-through hole together with the moulded body form the sole mechanically stabilizing component of the arrangement.

In accordance with at least one embodiment of the optoelectronic arrangement, all of the first semiconductor regions, all of the second semiconductor regions and/or all of the active regions were produced from a common, in particular single, first semiconductor layer, a common, in particular single, second semiconductor layer and/or a common, in particular single, active layer respectively. In other words, the pixels are produced by structuring and at least partial removal of a semiconductor layer sequence comprising a first semiconductor layer, a second semiconductor layer and an active layer.

In particular, it is possible that the pixels have been fitted jointly, that is to say in the wafer assemblage, at the top surface of the moulded body. By way of example, for this purpose, the semiconductor layer sequence is structured after the fitting of the moulded body. As a result, it is possible to provide an arrangement having a segmented luminous surface in which adjacent pixels have a small lateral distance. The lateral distances between the pixels are then limited for example only by the technique used for the segmentation. By way of example, the lateral distance between adjacent pixels with the use of a photographic technique is at most 5 μm in approximately 99.7% of the cases (so-called called 3-sigma range). Furthermore, it is possible to produce pixels having small extents in the lateral directions. In contrast to the segmented pixels described above, the lateral distance in the case of pixels that were fitted by means of individual positioning of the previously produced pixels at the top surface is at least 10 μm.

Furthermore, a method for producing an optoelectronic arrangement is specified. The optoelectronic arrangement is preferably producible by the method described here. That is to say that all features disclosed for the arrangement are also disclosed for the method, and vice versa.

In accordance with at least one embodiment of the method, firstly a semiconductor layer sequence is provided on a growth substrate. The semiconductor layer sequence comprises a first semiconductor layer, a second semiconductor layer and an active layer. The active layer can be provided for emitting and/or absorbing electromagnetic radiation.

In accordance with at least one embodiment of the method, the separating structures and the pixels are produced. For this purpose, the semiconductor layer sequence is removed in some locations using an etching process. In particular, trenches can be produced in the semiconductor layer sequence, which trenches can form separating structures between the pixels. The structuring of the pixels can be carried out using a photographic technique, for example.

In accordance with at least one embodiment of the method, the moulded body is produced at a side of the semiconductor layer sequence facing away from the growth substrate. In particular, it is possible for the moulded body to be produced at the side of the pixels facing away from the growth substrate. Here and hereinafter, "producing" the moulded body means that the material of the moulded body is applied at the semiconductor layer sequence. In particular, the material of the moulded body for producing the moulded body is present in liquid, granular, pasty and/or gaseous form.

In accordance with at least one embodiment of the method, the growth substrate is detached. The detaching can be carried out for example using an etching process or by means of laser lift-off. The optoelectronic arrangement can thus be free of a growth substrate.

In accordance with at least one embodiment of the method, the latter comprises the following steps:
  providing a semiconductor layer sequence comprising a first semiconductor layer, a second semiconductor layer and an active layer, on a growth substrate,
  producing the separating structures and the pixels by removing the semiconductor layer sequence in some locations using an etching process,
  producing the moulded body at a side of the semiconductor layer sequence facing away from the growth substrate, and
  detaching the growth substrate.

It is possible for the method steps to be carried out in the order indicated.

In accordance with at least one embodiment of the method, applying the moulded body and detaching the growth substrate are carried out before producing the separating structure and the pixels. In other words, the structuring of the pixels is carried out after the moulded body has been applied. In particular, the etching process is carried out after the moulded body has been produced at the semiconductor layer sequence.

In accordance with at least one embodiment of the method, the moulded body is applied using a potting method. Here and hereinafter, by way of example, injection moulding methods, compression moulding methods or transfer moulding methods are regarded as potting methods.

Alternatively or additionally, it is possible for the moulded body to be applied by lamination as a film, to be applied as lacquer and/or to be applied by means of chemical or physical vapour deposition.

The optoelectronic arrangement described here and the method for producing an optoelectronic arrangement described here are explained in greater detail below on the basis of exemplary embodiments and the associated figures.

FIGS. 1A, 1B, and 1C show exemplary embodiments of optoelectronic arrangements described here on the basis of schematic plan views and sectional illustrations.

FIGS. 2A, 2B, 2C, and 2D show exemplary embodiments of optoelectronic arrangements described here on the basis of schematic plan views and sectional illustrations.

FIG. 3 shows exemplary embodiments of optoelectronic arrangements described here on the basis of schematic plan views and sectional illustrations.

FIG. 4 shows exemplary embodiments of optoelectronic arrangements described here on the basis of schematic plan views and sectional illustrations.

FIGS. 6A-6B show exemplary embodiments of optoelectronic arrangements described here on the basis of schematic plan views and sectional illustrations.

FIG. 7 shows exemplary embodiments of optoelectronic arrangements described here on the basis of schematic plan views and sectional illustrations.

Elements that are identical, of identical type or act identically are provided with the same reference signs in the figures. The figures and the size relationships of the elements illustrated in the figures among one another should not be regarded as to scale. Rather, individual elements may be illustrated with exaggerated size in order to enable better illustration and/or in order to afford a better understanding.

Figure 1A:
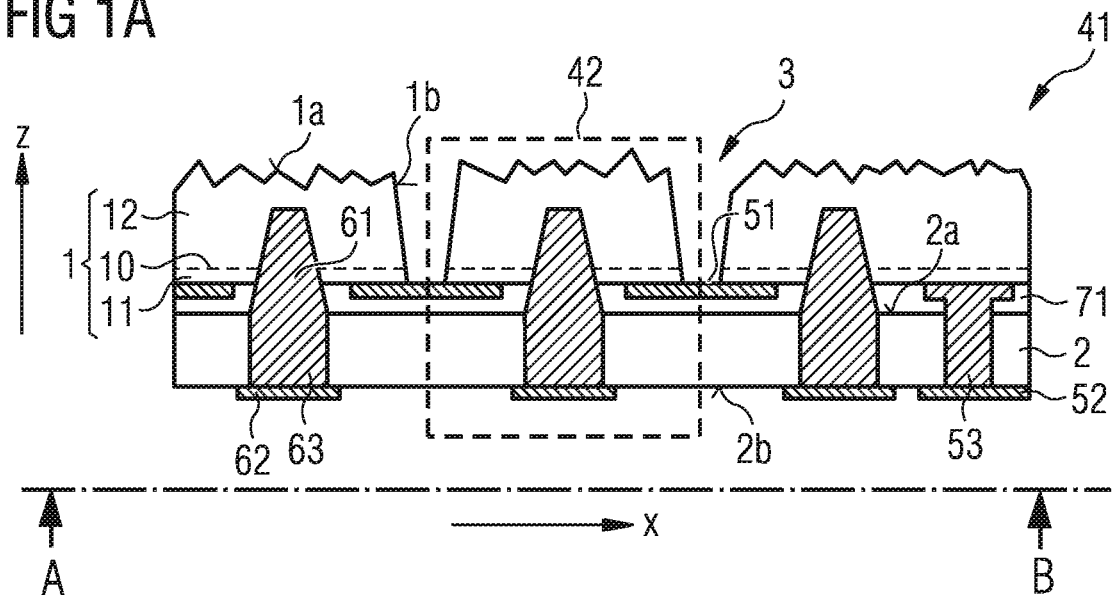
Figure 1B:
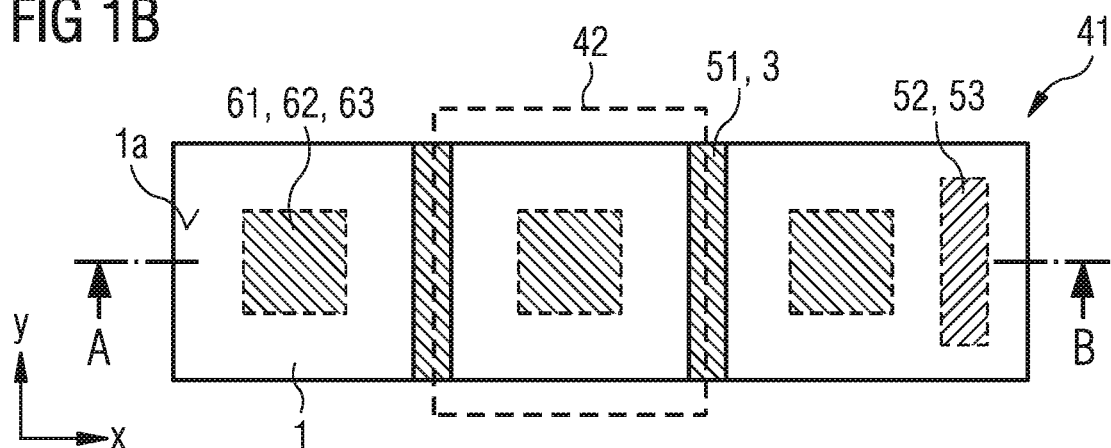
Figure 1C:
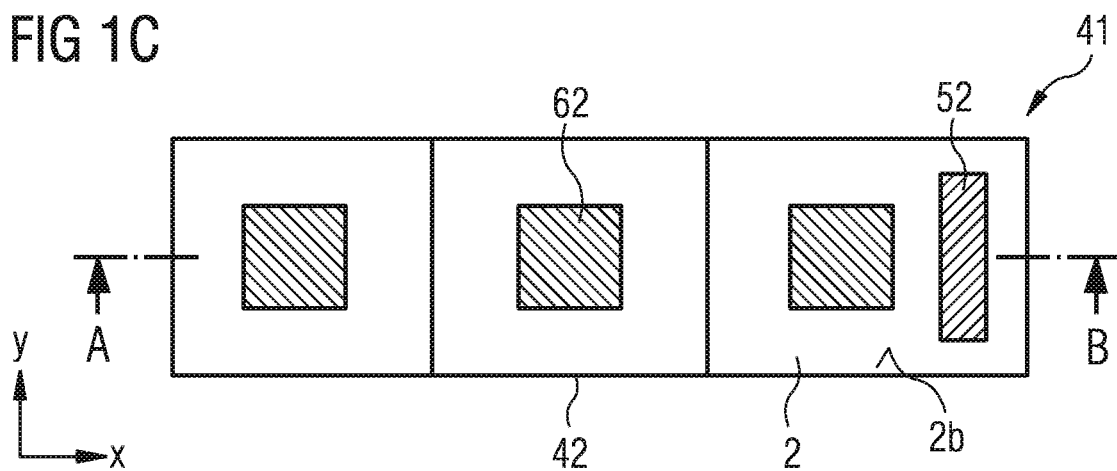

An exemplary embodiment of an optoelectronic arrangement described here is explained in greater detail on the basis of the schematic sectional illustration in FIG. 1A and the schematic plan views in FIGS. 1B and 1C. The section through the arrangement as illustrated in FIG. 1A is taken along a first sectional line AB. FIG. 1B shows a plan view from above, while FIG. 1C shows a plan view from below. Here and hereinafter, a plan view "from above" denotes a plan view of radiation passage surfaces 1a of the pixels 1 of the optoelectronic arrangement, while a plan view "from below" denotes a plan view of a side of the arrangement facing away from the radiation passage surfaces 1a.

The optoelectronic arrangement comprises a moulded body 2 having a top surface 2a and a bottom surface 2b facing away from the top surface 2a. The bottom surface 2b is freely accessible. The moulded body 2 serves for mechanically stabilizing the arrangement. The moulded body 2 extends along two lateral directions x, y spanning a main extension plane of the moulded body. The top surface 2a and the bottom surface 2b each form a principal plane of the moulded body.

A multiplicity of pixels 1 are fitted at the top surface 2a. The pixels 1 are assigned to a first pixel group 41. Furthermore, a second pixel group 42 is assigned to each pixel 1. The optoelectronic arrangement of the exemplary embodiment shown in figures IA, 1B and 1C comprises—purely by way of example—a single first pixel group 41, wherein all pixels 1 of the arrangement in FIGS. 1A, 1B and 1C are assigned to the first pixel group 41. Each of the second pixel groups 42 is then assigned a single pixel 1.

Each pixel 1 comprises a first semiconductor region 11, an active region 10 and a second semiconductor region 12. The first semiconductor region 11 can be formed with an n-conducting semiconductor material, for example. The second semiconductor region 12 can be formed with a p-conducting semiconductor material.

Furthermore, each pixel 1 has the radiation passage surface 1a facing away from the moulded body 2. The second semiconductor region 12 is roughened at the radiation passage surface 1a. The roughenings serve as coupling-out and/or coupling-in structures used to improve the transmission of the electromagnetic radiation through the radiation passage surface 1a.

Separating structures 3 are situated between two adjacent pixels 1. Side surfaces 1b of the pixels 1 directly adjoin the separating structures 3. In the exemplary embodiment illustrated in FIGS. 1A, 1B and 1C, the separating structures 3 are embodied as trenches, wherein the first semiconductor regions 11, the active regions 10 and the second semiconductor regions 12 are completely separated by the trenches.

The optoelectronic arrangement comprises a first contact structure 51, 52, 53, which is assigned one-to-one to the first pixel group 41. Furthermore, the arrangement comprises a multiplicity of second contact structures 61, 62, 63, wherein a second contact structure 61, 62, 63 is assigned one-to-one to each of the second pixel groups 42 of the arrangement.

The first contact structure 51, 52, 53 comprises a first contact plane 51, a second contact location 52 and at least one first plated-through hole 53. The first contact plane 51 is embodied in a continuous fashion. In particular, an outer surface of the first contact plane 51 is embodied in a multiply connected fashion in a plan view from the vertical direction z. The first contact plane 51 is freely accessible within the trenches of the separating structures 3. Alternatively, it is possible for a dielectric to be applied to the first contact plane 51 within the trenches of the separating structures 3. In this case, the first contact plane 51 is not freely accessible in the region of the trenches of the separating structures 3. The first contact plane 51 can be electrically conductively connected to the first semiconductor regions 11 of the pixels 1, and in particular can be in direct contact therewith. By way of example, the first semiconductor regions 11 of the pixels 1 can be at a common electrical potential.

The first contact plane 51 can be embodied in a radiation-reflecting fashion. The first contact plane 51 can be formed with a metal, such as silver or aluminium, for example, or consist of a metal.

The first contact plane 51 is electrically conductively connected to the first contact location 52 by means of the first plated-through hole 53. By way of example, the first plated-through hole 53 is formed with the same material as the first contact plane 51. The first plated-through hole 53 can be applied to the first contact plane 51 electrolytically. By way of example, the first plated-through hole 51 may have been electrodeposited in a production method in a method step carried out before the production of the moulded body 2. In particular, the first plated-through hole 53 can extend completely through the moulded body 2 in the vertical direction z.

The first contact location 52 is freely accessible and in particular electrically contactable at the bottom surface 2b (cf. FIGS. 1A and 1C). The first contact location 52 can be formed with at least one electrically conductive material, such as, for example aluminium, silver, palladium, gold, platinum, titanium, tin, copper or nickel, or consist of at least one of these materials.

An insulation layer 71 formed with an electrically insulating material, such as silicon nitride or oxide, for example, is fitted between the moulded body 2 and the first contact plane 51 and between the moulded body 2 and the pixels 1. The insulation layer 71 can serve for electrical insulation between the material of the pixels 1, such that an electrical connection is produced only by means of the first contact structure 51, 52 and 53 and the second contact structure 61, 62, 63. In particular, the insulation layer 71 can completely cover the top surface 2a of the moulded body 2 and be in direct contact with the top surface 2a. Furthermore, it is possible for locations of an outer surface of the first semiconductor region 11 facing the moulded body 2 which are not covered by the first contact plane 51 to be covered by the insulation layer 71 and be in direct contact therewith.

The second contact structure 61, 62, 63 comprises a second contact plane 61, a second contact location 62 and a second plated-through hole 63. The second plated-through hole 63 extends in the vertical direction z completely through the moulded body 2. The second plated-through hole 63 is additionally electrically conductively connected to the second contact location 62. The second contact location 62 is freely accessible and in particular electrically contactable at the bottom surface 2b (cf. FIGS. 1A and 1C).

In the present case, the second contact plane 61 is likewise embodied as an electrical plated-through hole, wherein the second contact plane 61 proceeding from the second plated-through hole 63 extends through the insulation layer 71, the first semiconductor region 11 and the active region 10 into the second semiconductor region 12 of the pixel 1 assigned to the second plated-through hole 63. The second contact plane 62 and the second plated-through hole 63 can be embodied integrally with one another. The second contact plane 61 can be electrically insulated from the first semiconductor region 11 and the active region 10 by means of a further insulating material (not shown in the figures).

The first contact plane 51 surrounds the second plated-through holes 63 in each case in a framelike fashion. In other words, in a plan view, the second plated-through holes 63 are enclosed by the first contact plane 51 in the lateral directions x, y at least in some locations, preferably completely. Furthermore, the first plated-through hole 53 is arranged laterally at a distance from one of the second plated-through holes 63.

The moulded body 2 completely surrounds the first plated-through hole 53 and the second plated-through holes 63 in lateral directions x, y. In particular, the first and second plated-through holes 53, 63 are laterally embedded by the moulded body 2.

Further exemplary embodiments of an optoelectronic arrangement described here are explained in greater detail on the basis of the schematic plan views in FIGS. 2A, 2B, 2C and 2D. A plan view from above is shown in each case. The exemplary embodiments illustrated may have along the first sectional line AB for example the construction discussed in association with FIG. 1A.

The optoelectronic arrangements illustrated in FIGS. 2A, 2B, 2C and 2D in each case comprise a multiplicity of pixels 1 which are assigned in each case to at least one first pixel group 41 and at least one second pixel group 42. The pixels 1 are arranged alongside one another in the lateral directions x, y. In this case, the construction of the exemplary embodiments of the optoelectronic arrangement in FIGS. 2A, 2B, 2C and 2D differs as follows.

In the exemplary embodiment in FIG. 2A, the pixels 1 have the same size and in particular the same extents in the lateral directions x, y. The pixels 1 are arranged in a matrixlike fashion in rows 43 and columns 44. The first contact location 51 extends across a plurality of pixels 1 of a column 44. It is alternatively possible for the arrangement to comprise a plurality of first contact locations 51. In this case, the pixels 1 can be assigned to a plurality of first pixel groups 41, wherein a first contact location 51 is assigned one-to-one to each first pixel group 41.

The pixels 1 of the exemplary embodiment in FIG. 2B are likewise arranged in a matrixlike fashion, wherein the pixels 1 of different rows 43 of the matrix have different extents in one of the lateral directions x, y.

Figure 2C:
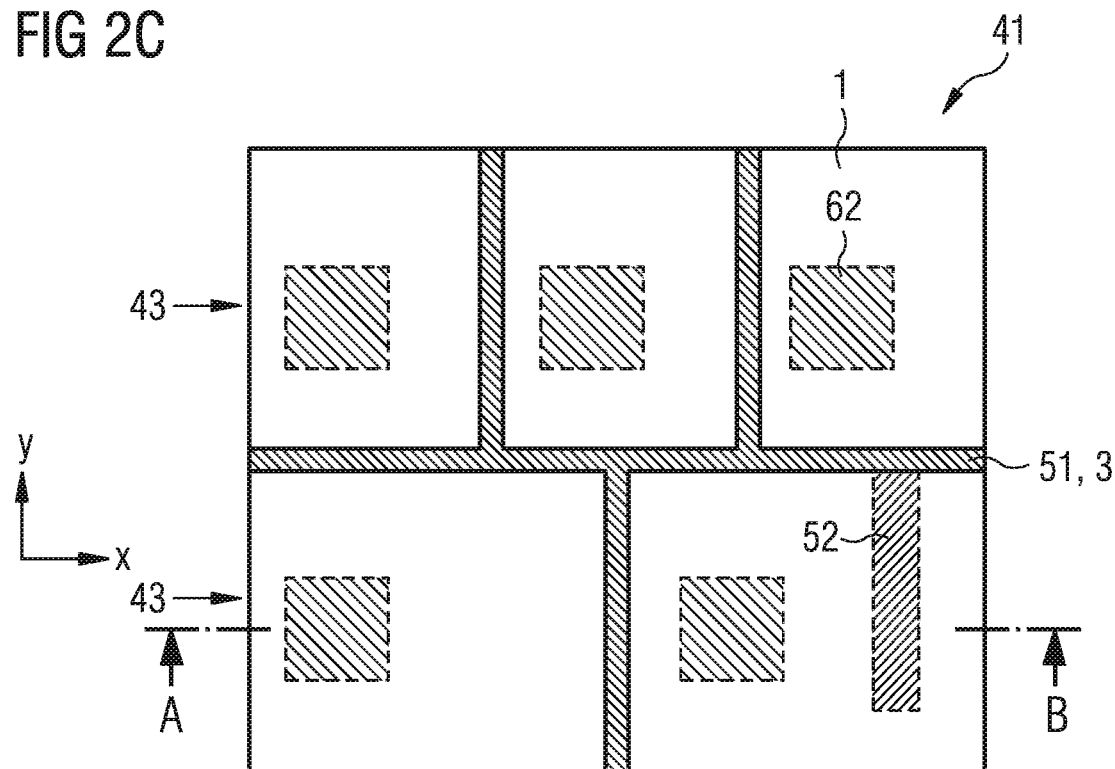

In the exemplary embodiment in FIG. 2C, the pixels 1 are arranged in rows, wherein the number of pixels 1 from at least two rows 43 differs and the pixels 1 of different rows 43 have different extents in the lateral directions x, y.

Figure 2D:
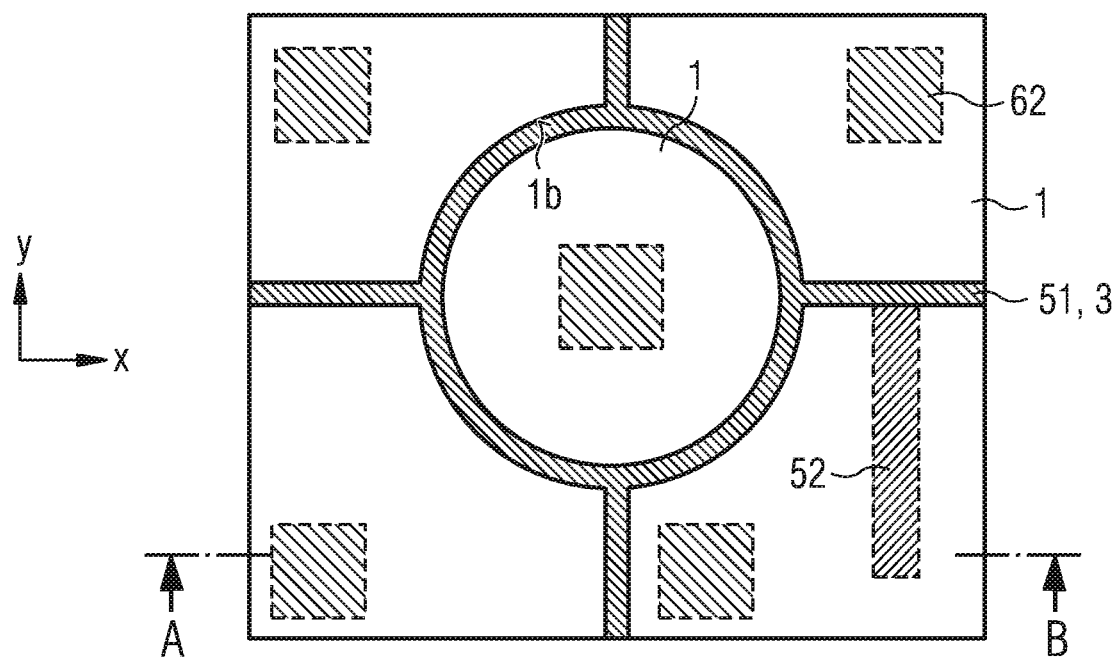

The pixels 1 of the exemplary embodiment in FIG. 2D have different shapes and different extents in the lateral directions x, y. At least one of the pixels 1 can be embodied in an elliptical fashion, in particular in a circular fashion, in a plan view. The pixels 1 adjoining the elliptical pixels 1 have at least one curved side surface 1b.

A further exemplary embodiment of an optoelectronic arrangement described here is explained in greater detail on the basis of the schematic plan view from above shown in FIG. 3. The arrangement comprises a multiplicity of pixels 1 which are arranged in a matrixlike fashion in rows 43 and columns 44. Purely by way of example, all pixels 1 are assigned to a single first pixel group 41. The dashed lines between the pixels indicate that the number of rows 43 and columns 44 and in particular the number of pixels 1 can be scaled arbitrarily. In particular, the number of rows 43 and columns 44 can be adapted to the respective technical requirement. All the pixels 1 are applied on the common moulded body 2. The moulded body 2 can project beyond the pixels 1 in the lateral directions x, y.

A further exemplary embodiment of an optoelectronic arrangement described here is explained in greater detail on the basis of the schematic plan view from above shown in FIG. 4. The pixels 1 of the arrangement are once again arranged in a matrixlike fashion in rows 43 and columns 44. In contrast to the exemplary embodiment shown in FIG. 3, the pixels 1 are assigned to a respective row 43 of a first pixel group 41 and the pixels are assigned to a respective column 44 of a second pixel group. A first pixel group 41 and a second pixel group 42 are assigned to each pixel 1.

The electrical contacting of the pixels 1 of the first pixel group 41 is effected in each case by means of a first contact structure 51, 52, 53 having in each case a first contact plane 51 and a contact location 52. Furthermore, the electrical contacting of the pixels 1 of the second pixel group 42 is effected in each case by means of a second contact structure 61, 62, 63 having in each case a second contact plane 61 and a second contact location 62. The second semiconductor regions 12 of the pixels 1 of a respective one of the second pixel groups 42 are electrically conductively connected to one another by means of the second contact plane 62 assigned to the second pixel group 42.

Such a division into first pixel groups 41 assigned to a respective row 43 and second pixel groups 42 assigned to a respective column 44 makes it possible for the pixels 1 to be electrically driven in each case individually by means of a small number of first and second contact locations 52, 62, respectively.

Further exemplary embodiments of an optoelectronic arrangement described here are explained in greater detail on the basis of the sectional illustrations in FIGS. 5A, 5B, 6A, 6B and 7. The illustrated sections through the arrangement are taken along a second sectional line CD illustrated in FIG. 4, or along a third sectional line C'D'.

Figure 5A:
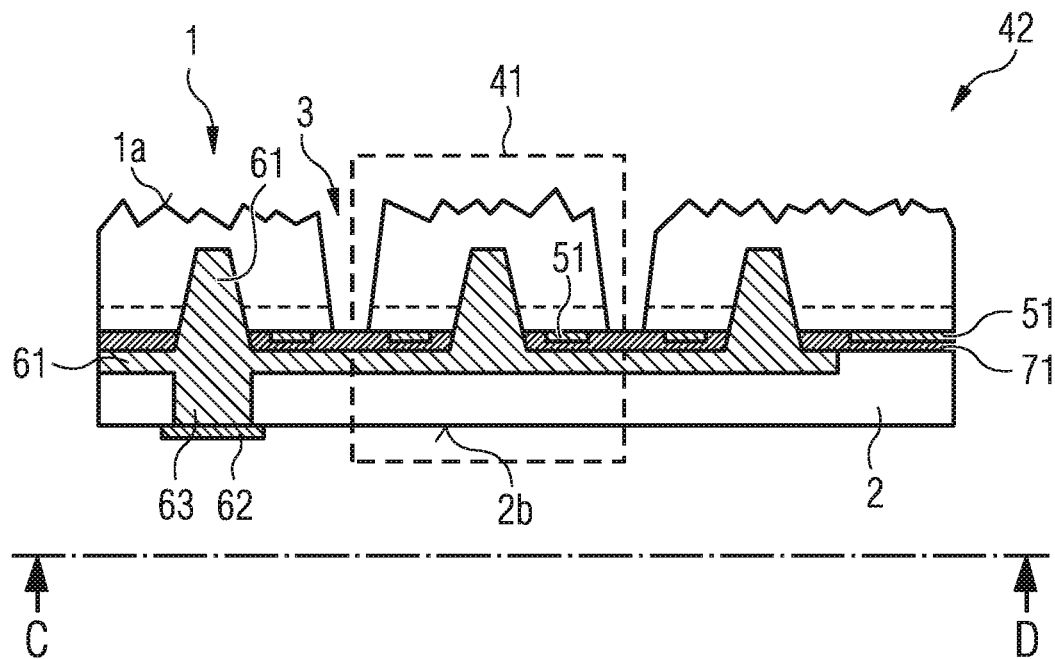
FIGS. 5A-5B show exemplary embodiments of optoelectronic arrangements described here on the basis of schematic plan views and sectional illustrations.

An electrical contacting of the pixels 1 of one exemplary embodiment of the arrangement described here is explained in greater detail on the basis of the sectional illustration in FIG. 5A running along the third sectional line CD. The separating structures 3 between the pixels 1 are embodied as in the exemplary embodiment shown in FIG. 1A. A second contact structure 61, 62, 63 having a second contact location 62, a second contact plane 61 and at least one second plated-through hole 63 is assigned one-to-one to each second pixel group 42.

The second semiconductor regions 12 of the pixels 1 of the respective second pixel group 42 are electrically conductively connected to one another by means of the second contact plane 61. In the case of a plurality of pixels 1 per second pixel group 42, the second contact plane 61 can comprise the electrical plated-through hole through the pixels 1 as explained in association with FIG. 1A and can comprise, in addition, an electrically conductive layer embodied in an integral fashion and formed with a metal, for example. The second contact plane 61 can be embodied in a radiation-reflecting fashion at least in some locations. The first semiconductor regions 11 of the pixels 1 can furthermore be electrically conductively connected in each case to further pixels 1 of the first pixel group 41 by means of a plurality of first contact planes 51.

Figure 5B:
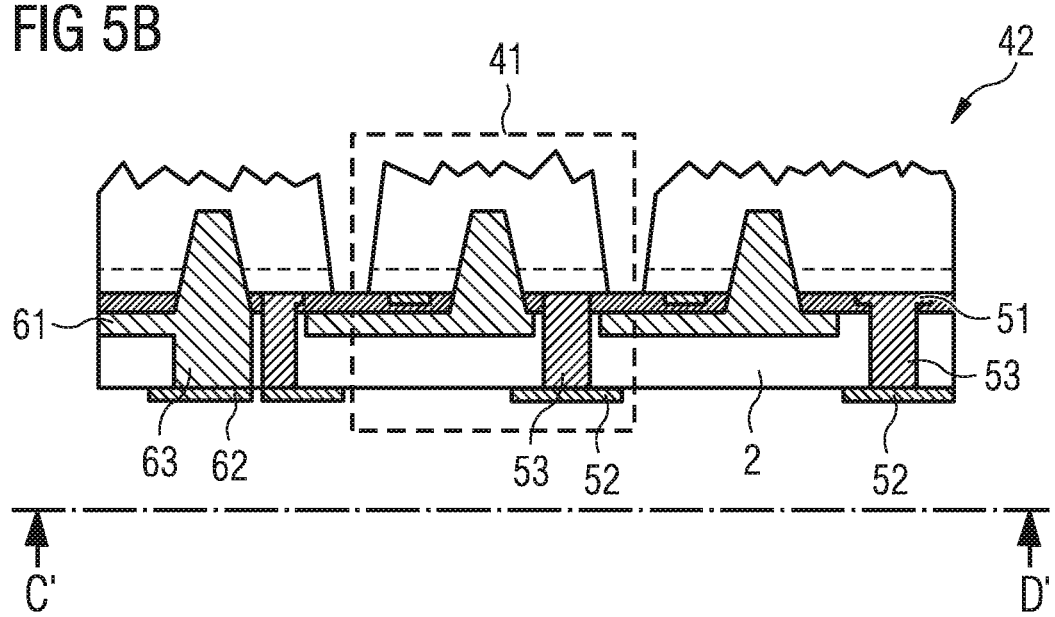

An electrical contacting of the pixels 1 of an exemplary embodiment of the arrangement described here is explained in greater detail on the basis of the sectional illustration in FIG. 5B running along the third sectional line C'D'. The second semiconductor regions 12 are electrically contacted and connected by means of the second contact structure 61, 62, 63. The construction of the second contact structure 61, 62, 63 corresponds to that in FIG. 5A. The first semiconductor regions 11 are electrically contactable by means of first contact structures 51, 52, 53, wherein a first contact structure 51, 52, 53 is assigned one-to-one to each first pixel group 41. The first plated-through holes 53 of the first contact structures 51, 52, 53 are in each case arranged laterally at a distance from the second plated-through holes 63 of the second contact structure 61, 62, 63.

A further exemplary embodiment of the arrangement described here is explained in greater detail on the basis of the sectional illustration in FIG. 6A taken along the second sectional line CD and the sectional illustration in FIG. 6B taken along the third sectional line C'D'. In contrast to the exemplary embodiments described in association with FIGS. 1A, 5A and 5B, only the first semiconductor regions 11 and the active regions 12 of adjacent pixels 1 are completely separated from one another by the separating structures 3 embodied as trenches. The second semiconductor regions 12 are connected to one another via intermediate regions 31. The moulded body 2 extends into the separating structures 3 embodied as trenches. The separating structures 3 are thus formed by the moulded body 2. Furthermore, the insulation layer 71 is arranged partly in the trenches of the separating structures 3. Such an embodiment of the separating structures 3 is possible for all exemplary embodiments of the optoelectronic arrangement described here.

A further exemplary embodiment of the arrangement described here is explained in greater detail on the basis of the sectional illustration in FIG. 7 taken along the second sectional line CD. The exemplary embodiment shown substantially corresponds to that in FIG. 6A, wherein the separating structures 3 are now formed by a degenerate semiconductor material 32. By way of example, for this purpose, regions of the first semiconductor layer 111 are backsputtered in a production method. The backsputtering can be carried out for example by means of a treatment of the first semiconductor layer with a plasma, such as, for example, an argon plasma, a hydrogen plasma and/or an oxygen plasma. The treatment results in an at least partial destruction of the conductivity of the material of the first semiconductor layer 111 and thus a redoping to form the degenerate semiconductor material 32. The degenerate semiconductor material 32 is embodied in particular in a non-conducting fashion.

Figure 8A:
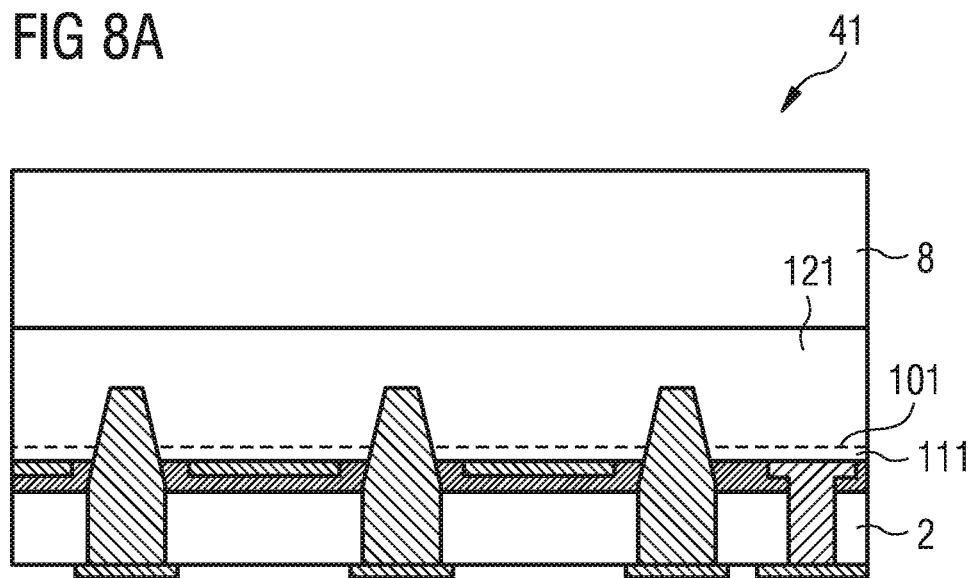
FIGS. 8A-8B show an exemplary embodiment of a method for producing an optoelectronic arrangement described here on the basis of schematic sectional illustrations.
Figure 8B:
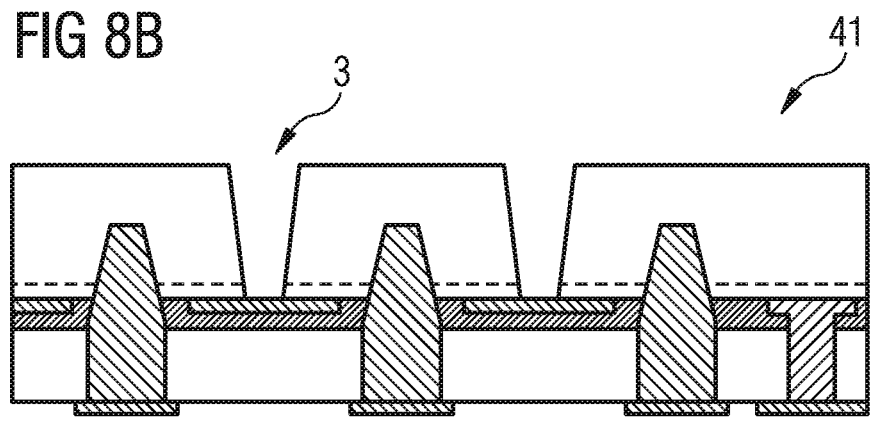

Exemplary embodiments of a method for producing an optoelectronic arrangement described here are explained in greater detail on the basis of the schematic sectional illustrations in FIGS. 8A and 8B. In the first method step in FIG. 8A, a semiconductor layer sequence 111, 101, 121, comprising a first semiconductor layer 111, an active layer 101 and a second semiconductor layer 121, is provided on a growth substrate 8. The moulded body 2 has already been produced at a side of the semiconductor layer sequence 111, 101, 121 facing away from the growth substrate 8. Before the production of the moulded body 2, a first contact structure 51, 52, 53 and a second contact structure 61, 62, 63 can be deposited onto the semiconductor layer sequence 111, 101, 121 for example by electrodeposition.

In the method step illustrated in FIG. 8B, the growth substrate 8 is detached. Separating structures 3 have been introduced into the semiconductor layer sequence 111, 101, 121 by means of etching. In particular, introducing separating structures 3 can be carried out after applying the moulded body 2.

As an alternative to the method shown in FIGS. 8A and 8B, producing the moulded body 2 can also be carried out after structuring the pixels 1. The growth substrate 8 is then detached after the pixels 1 have been produced.

The present application claims the priority of the German application DE 102015111574.3 the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

We claim:

1. A method for producing an optoelectronic arrangement, comprising the following steps:
   providing a semiconductor layer sequence comprising a first semiconductor layer, a second semiconductor layer and an active layer on a growth substrate,
   producing separating structures and pixels by removing the semiconductor layer sequence in some locations using an etching process such that the pixels are spatially separated in pixels of a first pixel group and pixels of a second pixel group,
   depositing a first contact structure and a second contact structure onto the semiconductor layer sequence,
   producing an electrical insulating body at a side of the semiconductor layer sequence facing away from the growth substrate, and
   detaching the growth substrate, wherein
      the first contact structure has a first contact plane, a first plated-through hole extending through the electrical insulating body and a first contact location, the first contact location is freely accessible at a bottom surface of the electrical insulating body facing away from a top surface of the electrical insulating body, the top surface of the electrical insulating body contacting the side of the semiconductor layer sequence, and the first semiconductor regions of the pixels of the first pixel group are electrically conductively connected to one another exclusively by the first contact plane and are electrically contactable by the first contact location.

2. The method according to claim 1, wherein producing the electrical insulating body and detaching the growth substrate are carried out before producing the separating structure and the pixels.

3. The method according to claim 1, wherein the electrical insulating body is applied by a potting method.

4. The method according to claim 1, wherein trenches are produced in the semiconductor layer sequence, which trenches form the separating structures between the pixels.

5. The method according to claim 1, wherein the pixels of the first pixel group are arranged alongside one another at a top surface of the optoelectronic arrangement, and the first semiconductor regions and/or the second semiconductor regions of adjacent pixels of the first pixel group are spatially separated from one another by the separating structures.

6. The method according to claim 1, wherein the first contact plane is directly connected to the first plated-through hole.

7. The method according to claim 1, wherein the first semiconductor regions and the active regions of adjacent pixels are spatially completely separated from one another by the separating structures, and the second semiconductor regions of adjacent pixels are connected to one another via intermediate regions formed with the material of the second semiconductor regions.

8. The method according to claim 1, wherein each pixel is individually drivable.

9. The method according to claim 1, wherein the electrical insulating body is a mechanically stabilizing component of the arrangement.

10. A method for producing an optoelectronic arrangement, comprising the following steps:

providing a semiconductor layer sequence comprising a first semiconductor layer, a second semiconductor layer and an active layer on a growth substrate, producing separating structures and pixels by removing the semiconductor layer sequence in some locations using an etching process such that the pixels are spatially separated in pixels of a first pixel group and pixels of a second pixel group producing an electrical insulating body at a side of the semiconductor layer sequence facing away from the growth substrate, and detaching the growth substrate, wherein:

the first semiconductor regions and the active regions of adjacent pixels are spatially completely separated from one another by the separating structures, and the second semiconductor regions of adjacent pixels are connected to one another via intermediate regions formed with the material of the second semiconductor regions.

* * * * *